United States Patent
Sato et al.

(10) Patent No.: US 11,682,642 B2
(45) Date of Patent: Jun. 20, 2023

(54) INTEGRATED CIRCUIT (IC) DEVICE INCLUDING A FORCE MITIGATION SYSTEM FOR REDUCING UNDER-PAD DAMAGE CAUSED BY WIRE BOND

(71) Applicant: Microchip Technology incorporated, Chandler, AZ (US)

(72) Inventors: Justin Sato, West Linn, OR (US); Bomy Chen, Newark, CA (US); Andrew Taylor, Tigard, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 159 days.

(21) Appl. No.: 17/019,768

(22) Filed: Sep. 14, 2020

(65) Prior Publication Data

US 2020/0411462 A1    Dec. 31, 2020

Related U.S. Application Data

(62) Division of application No. 16/157,826, filed on Oct. 11, 2018, now Pat. No. 10,896,888.

(Continued)

(51) Int. Cl.
*H01L 23/00*   (2006.01)
*H01L 23/10*   (2006.01)
*H01L 21/768*   (2006.01)

(52) U.S. Cl.
CPC ............ *H01L 24/09* (2013.01); *H01L 21/768* (2013.01); *H01L 21/76802* (2013.01);

(Continued)

(58) Field of Classification Search
CPC . H01L 24/09; H01L 21/768; H01L 21/76802; H01L 23/10; H01L 23/562;

(Continued)

(56) References Cited

U.S. PATENT DOCUMENTS 5,539,243 A    7/1996   Matsuki ...................... 257/584
6,143,396 A    11/2000  Saran et al. ................ 428/162

(Continued)

OTHER PUBLICATIONS

International Search Report and Written Opinion, Application No. PCT/US2019/021767, 14 pages, dated Jun. 18, 2019.

(Continued)

*Primary Examiner* — Thanh T Nguyen
(74) *Attorney, Agent, or Firm* — Slayden Grubert Beard PLLC

(57) ABSTRACT

An integrated circuit chip (die) may include a force mitigation system for reducing or mitigating under-pad stresses typically caused by wire bonding. The IC die may include wire bond pads and a force mitigation system formed below each wire bond pad. The force mitigation system may include a "shock plate" (e.g., metal region), a sealing layer located above the shock plate, and a force mitigation layer including an array of sealed voids between the metal region and the sealing layer. The sealed voids in the force mitigation layer may be defined by forming openings in an oxide dielectric layer and forming a non-conformal sealing layer over the openings to define an array of sealed voids. The force mitigation system may mitigate stresses caused by a wire bond on each wire bond pad, which may reduce or eliminate wire-bond-related damage to semiconductor devices located in the under-pad regions of the die.

22 Claims, 13 Drawing Sheets

Related U.S. Application Data

(60) Provisional application No. 62/643,226, filed on Mar. 15, 2018.

(52) U.S. Cl.
CPC ............ *H01L 23/10* (2013.01); *H01L 23/562* (2013.01); *H01L 24/03* (2013.01); *H01L 24/05* (2013.01); *H01L 24/49* (2013.01); *H01L 2224/03622* (2013.01); *H01L 2224/04042* (2013.01); *H01L 2224/05019* (2013.01); *H01L 2224/05572* (2013.01); *H01L 2224/05624* (2013.01); *H01L 2924/00014* (2013.01); *H01L 2924/10253* (2013.01); *H01L 2924/14* (2013.01); *H01L 2924/3512* (2013.01); *H01L 2924/386* (2013.01)

(58) Field of Classification Search
CPC ......... H01L 24/03; H01L 24/05; H01L 24/49; H01L 2224/03622; H01L 2224/04042; H01L 2224/05019; H01L 2224/05572; H01L 2224/05624; H01L 2924/00014; H01L 2924/10253; H01L 2924/14; H01L 2924/3512; H01L 2924/386
See application file for complete search history.

(56) References Cited

U.S. PATENT DOCUMENTS

| | | | |
|---|---|---|---|
| 6,232,662 B1 | 5/2001 | Saran | 257/750 |
| 6,346,472 B1 | 2/2002 | Lopatin et al. | 438/627 |
| 6,448,650 B1 | 9/2002 | Saran et al. | 257/758 |
| 6,625,882 B1 | 9/2003 | Saran et al. | 29/843 |
| 6,825,563 B1 | 11/2004 | Ranganathan et al. | 257/758 |
| 6,963,138 B2 | 11/2005 | Low et al. | 257/760 |
| 7,157,734 B2 | 1/2007 | Tsao et al. | 257/48 |
| 7,301,231 B2 | 11/2007 | Antol et al. | 257/700 |
| 8,034,693 B2 | 10/2011 | Shibata et al. | 438/422 |
| 8,084,279 B2 | 12/2011 | Kasaoka et al. | 438/17 |
| 9,117,799 B2 | 8/2015 | Akino | |
| 9,508,622 B2 | 11/2016 | Higgins, III | |
| 9,659,886 B2 | 5/2017 | Lin et al. | |
| 10,002,785 B2 | 6/2018 | Sato et al. | |
| 10,249,574 B2 | 4/2019 | Ling | |
| 10,269,770 B2 | 4/2019 | Huang et al. | |
| 2002/0089062 A1 | 7/2002 | Saran et al. | 257/759 |
| 2004/0253801 A1 | 12/2004 | Lin | 438/612 |
| 2005/0116338 A1 | 6/2005 | Hirai | 257/734 |
| 2005/0245060 A1 | 11/2005 | Chiu | 438/612 |
| 2006/0113681 A1 | 6/2006 | Jeong et al. | 257/780 |
| 2009/0102059 A1* | 4/2009 | Ishii | H01L 23/5226 257/E23.145 |
| 2010/0140814 A1 | 6/2010 | Jones et al. | 257/786 |
| 2010/0330799 A1* | 12/2010 | Hamanaka | H01L 21/7682 257/E21.585 |
| 2011/0084390 A1 | 4/2011 | Chen | 257/738 |
| 2012/0248618 A1 | 10/2012 | Akino | 257/773 |
| 2013/0241058 A1 | 9/2013 | Yu et al. | 257/738 |
| 2015/0333003 A1* | 11/2015 | Huang | H01L 23/5223 257/532 |

OTHER PUBLICATIONS

Taiwan Office Action, Application No. 108107168, 9 pages, dated Jul. 18, 2022.

* cited by examiner

INTEGRATED CIRCUIT (IC) DEVICE INCLUDING A FORCE MITIGATION SYSTEM FOR REDUCING UNDER-PAD DAMAGE CAUSED BY WIRE BOND

RELATED PATENT APPLICATION

Cross-Reference to Related Applications

This application is a divisional of U.S. application Ser. No. 16/157,826 filed on Oct. 11, 2018, which claims benefit from provisional application No. 62/643,226 filed on Mar. 15, 2018, incorporated herein in their entirety.

TECHNICAL FIELD

The present disclosure relates to integrated circuit (IC) devices and manufacturing, and more particularly, to IC devices including a force mitigation system, e.g., including an array of sealed voids, for reducing under-pad damage caused by a wire/ball bond process, and methods for forming such IC devices.

BACKGROUND

Many integrated circuit (IC) devices require wire bonding, e.g., to connect a silicon chip (die) to one or more leads or other conductive elements. Each wire may be bonded at one end to a respective bond pad on an upper surface of the silicon chip, and at the other end to a lead or other off-chip circuit component.

Wire bonds may exert a relatively large force on the respective bond pads, which may introduce large stresses in the chip below the bond pads (e.g., downward, megasonic, thermal forces). In addition, in some instances, stresses may be introduced by the deposition of passivation and/or aluminum layers during the fabrication process. Failure analysis reports and images show cracks extending down into the chip, which may damage semiconductor components located in the regions below the bond pads. Thus, chip manufactures may avoid forming certain types of semiconductor components, e.g., non-electrostatic-sensitive devices (non-ESDs) and/or other types of components, below the bonds pads, known as "circuitry under pad" (CUP), due to the stress/damage resulting from the wire bonds. This is problematic, especially as silicon die size continues to decrease, as the bond pad metal defines an increasingly large percentage of the die area.

Prior solutions include forming solid metal plates in the die body for absorbing forces below the pad metal, and forming interlaced patterns of metal and dielectric for mitigating the under-pad damage caused by wire bond. However, these solutions require additional layers of metal and/or dielectric, which reduces the area of usable real estate in the chip

SUMMARY

Embodiments of the present invention provide an integrated circuit chip (die) including a force mitigation system for reducing or mitigating under-pad stresses caused by wire bonding, and a method of forming such IC die. The IC die may include wire bond pads and a force mitigation system formed below each wire bond pad. The force mitigation system may include a "shock plate" (e.g., metal region), a sealing layer located above the shock plate, and a force mitigation layer including an array of sealed voids between the metal region and the sealing layer. The sealed voids in the force mitigation layer may be defined by forming openings in an oxide dielectric layer and forming a non-conformal sealing layer over the openings to define an array of sealed voids. The force mitigation system may mitigate stresses caused by a wire bond on each wire bond pad, which may reduce or eliminate wire-bond-related damage to semiconductor devices located in the under-pad regions of the die.

Some embodiments provide a method of forming a silicon die, including forming a metal region above a substrate, forming a non-metal layer over the metal region, forming a plurality of openings in the non-metal layer, forming a sealing layer over the plurality of openings in the non-metal layer to define a plurality of sealed voids over the metal region, and forming a wire bond pad over the sealing layer.

In some embodiments, semiconductor devices are formed in a region of the die below the metal region. The semiconductor devices may include at least one non-electrostatic-sensitive device (non-ESD).

In one embodiment, the method includes forming a dielectric region over the substrate, and forming the metal region on or in the dielectric region over the substrate.

In one embodiment, the non-metal layer over the metal region comprise an oxide dielectric layer, and forming a plurality of openings in the non-metal layer comprises forming a plurality of vias in the oxide dielectric layer.

In one embodiment, forming a sealing layer over the plurality of openings in the non-metal layer comprises forming a non-conformal inter-metal dielectric (IMD) layer over the plurality of openings. In one embodiment, the method further includes forming a passivation layer over the sealed voids.

In one embodiment, a two-dimensional array of openings are formed in the non-metal layer to define a two-dimensional array of sealed voids.

In one embodiment, the method further includes forming at least one metal line in or above the sealing layer, wherein the wire bond pad is conductively coupled to the at least one metal line in or above the sealing layer.

In one embodiment, a partial vacuum is created in the sealed voids.

Another embodiment provides a silicon die including a substrate, and one or more wire bond regions, each wire bond region including a metal region located above the substrate, a sealing layer located above the non-metal layer, a force mitigation layer located between the metal region and the sealing layer, a plurality of sealed voids defined in the force mitigation layer, and a wire bond pad formed over the sealing layer. One or more semiconductor devices may be formed in a region of the die below the force mitigation layer and metal region.

Another embodiment provides a silicon die including a substrate, a wire bond pad, one or more semiconductor devices formed below the wire bond pad, and a force mitigation system located below the wire bond pad and above the one or more semiconductor devices. The force mitigation system may include a metal shock plate region, and a force mitigation layer above the metal shock plate region, the force mitigation layer including a plurality of sealed voids defined in a non-metal region.

Another embodiment provides an electronic device including a silicon die as disclosed above, one or more conductive leads, and one or more wires, each having a first end bonded to a respective wire bond pad on the silicon die and a second end bonded to a respective lead.

BRIEF DESCRIPTION OF THE DRAWINGS

Example aspects of the present disclosure are described below in conjunction with the figures, in which.

DETAILED DESCRIPTION OF THE INVENTION

Embodiments of the present invention provide an integrated circuit chip (die) including a force mitigation system for reducing or mitigating under-pad stresses caused by wire bonding, and a method of forming such IC die. The force mitigation system may include an array of sealed voids (e.g., as a partial vacuum) formed in a force mitigation layer. In some embodiments, the force mitigation system may include may also include a "shock plate" (e.g., metal region) located below the force mitigation layer. In some embodiments the sealed voids are sandwiched between the bond pad metal layer and a non-top metal layer to create a void cushion. In addition, embodiments of the present invention may reduce or mitigate stresses that are introduced by the deposition of passivation and/or aluminum layers in conventional fabrication processes.

FIGS. 1A-8B illustrate an example method of forming an integrated circuit (IC) die including a force mitigation system for reducing or mitigating under-pad stresses caused by wire bonding on the die, according to one example embodiment. In this example embodiment, the force mitigation system includes (a) a metal "shock plate" and (b) a force mitigation layer including an array of voids located above the shock plate.

Figure 1A:
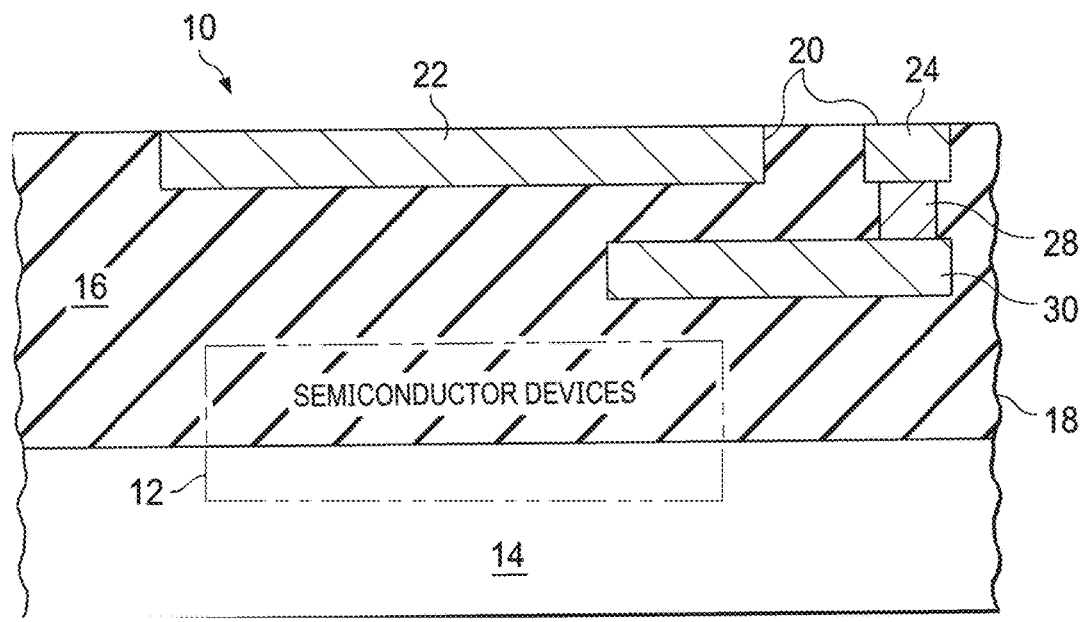
FIGS. 1A-8B illustrate an example method of forming an integrated circuit (IC) die including an array of voids for reducing or mitigating under-pad stresses caused by wire bonding on the die, according to one embodiment of the invention.
Figure 1B:
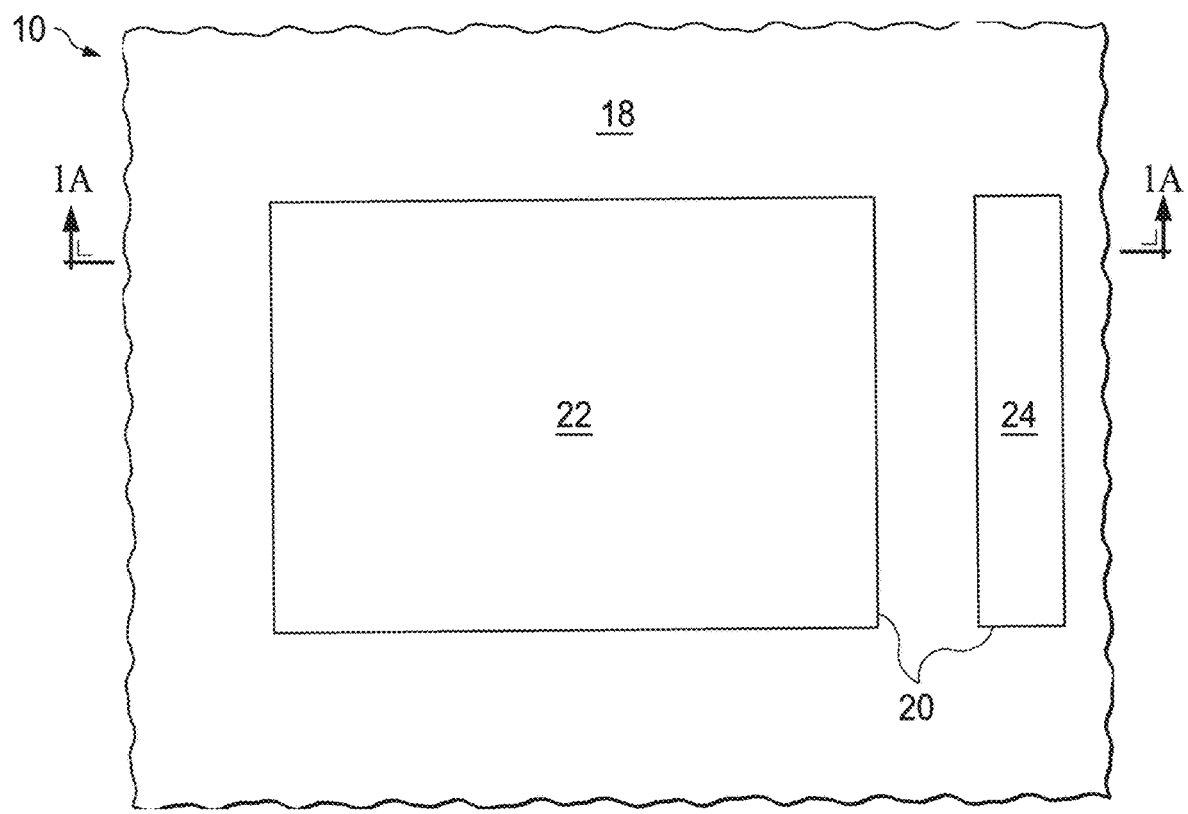

FIGS. 1A and 1B show a cross-sectional side view and a top view, respectively, of an example IC die structure 10 in fabrication. The die 10 may include one or more types of semiconductor devices 12, including electrostatic-sensitive devices (ESDs) and/or non-ESDs, formed in the die substrate 14 (e.g., silicon substrate) and/or above the die substrate 14, indicated as region 16. Region 16 may include a dielectric field 18 and/or any other layers or regions of any suitable material(s).

As discussed below, semiconductor devices 12 may be protected from damage caused by a wire bond performed above the semiconductor devices 12 (after further processing of the die 10) by a force mitigation structure, e.g., (a) including a force mitigation layer including an array of sealed voids and/or (b) a shock plate arranged below the force mitigation layer. The illustrated embodiment includes both a shock plate and force mitigation layer.

As shown in FIGS. 1A and 1B, a metal layer 20 may be formed in a dielectric field region formed over the substrate. Metal layer 20 may include a "shock plate" region 22 and one or more vias or other conductive regions 24 coupled to one or more other metal layers already formed or subsequently formed, e.g., at least one via 28 and lower metal layer 30 shown in FIG. 1A. Metal layer 20 may comprise copper or any other suitable metal.

Figure 2A:
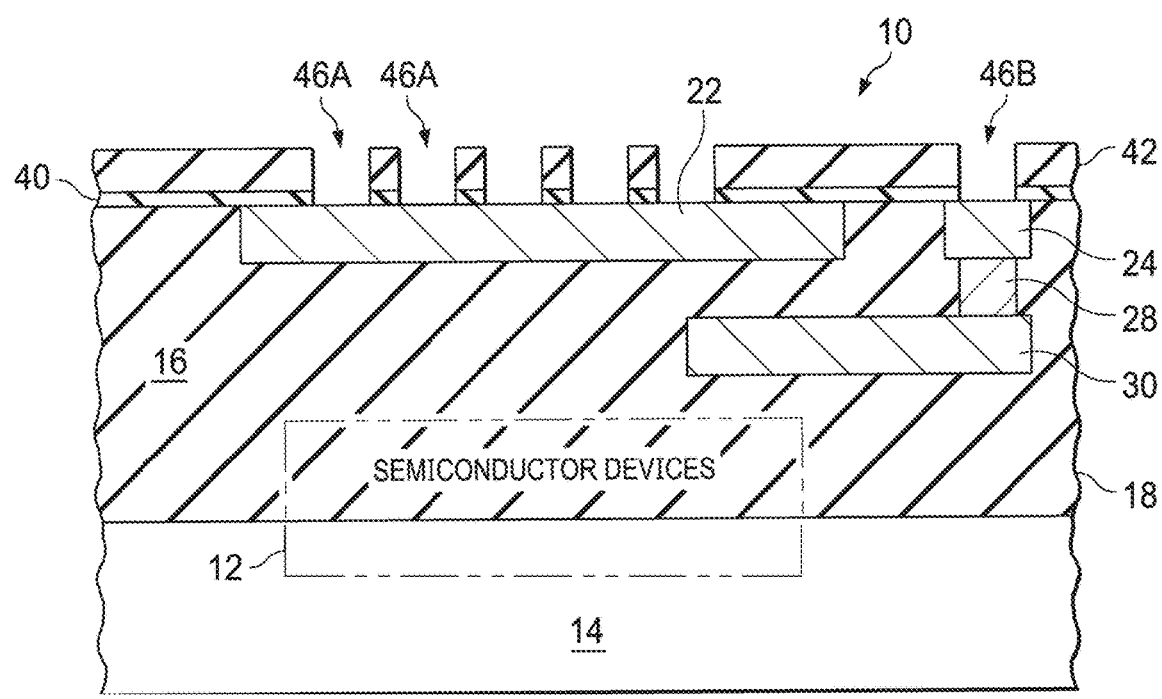
Figure 2B:
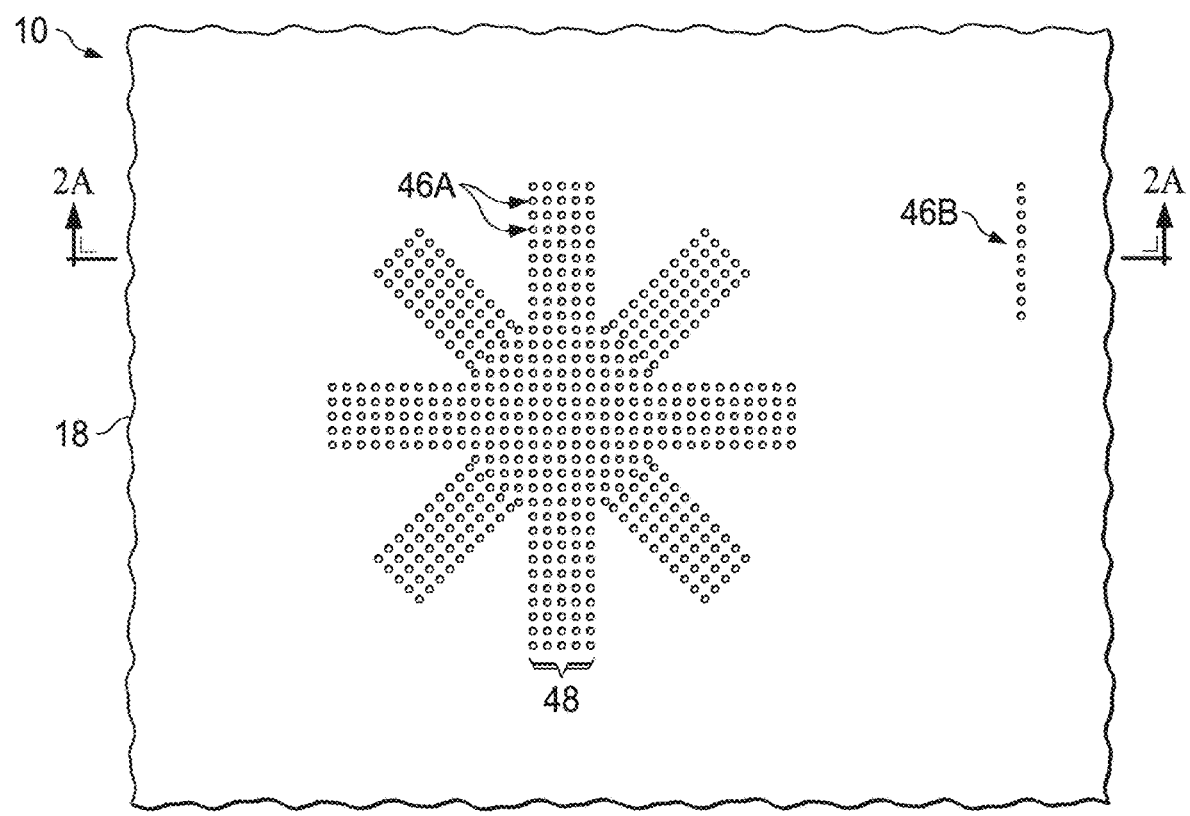

FIGS. 2A and 2B show the side cross-sectional view and top view, respectively, of the IC die structure 10 after further processing. As shown, a Cu barrier dielectric layer 40 (e.g., including SiN or SiC) may be formed over the shock plate metal layer 20, followed by a non-metal layer 42 formed over the Cu barrier dielectric layer 40. Non-metal layer 42 may comprise an oxide dielectric layer, for example. Non-metal layer 42 may have any suitable thickness, e.g., between 1,000 Å-8,000 Å, for example 4,000 Å.

An array of openings 46A (empty vias) may then be formed in the non-metal layer 42 in an area over the shock plate 22, and an opening 46B may also be formed over each via/conductive region 28 connected to other metal layer(s), e.g., metal layer 30 shown in FIG. 2A. The openings 46A and 46B may be formed by any suitable photolithography techniques, e.g., known masking and etching techniques.

The array of openings 46A formed over the shock plate may include any number of openings 46A arranged in any one-dimensional or two-dimensional pattern. FIG. 2B shows one example two-dimensional pattern of openings 46A, which comprises a star or asterisk-shaped pattern consisting of 5 µm wide lines, indicated at 48, filled with dense via openings 46A. The illustrated pattern is an example only; openings 46A may be formed in any other one-dimensional or two-dimensional pattern, e.g., a pattern defining one or more lines or rows or openings (e.g., rows extending parallel, perpendicular, or otherwise), a checkerboard pattern, a pattern of concentric circles, or any other geometric pattern. The individual openings 46A may have any shape and dimensions, and the different ones of the openings 46A in the array may have the same shape and dimensions, or may have different shapes and/or dimensions. In some embodiments, openings 46A may extend down to the metal shock plate 22. In other embodiments, one, some, or all openings 46A may extend only partially down into the non-metal layer 42 (e.g., oxide dielectric layer) over the metal shock plate 22.

In some embodiments, individual openings 46A may have a square or circular shape (as viewed from the top) with a width in the range of 0.060 µm to 0.250 µm, for example 0.18 µm. In some embodiments, each opening 46A may have a width/depth ratio between 0.10 and 2.5, or between 0.25 and 1.0. For example, each opening 46A may have a width of 0.16 µm and a depth of 0.40 µm.

Figure 3A:
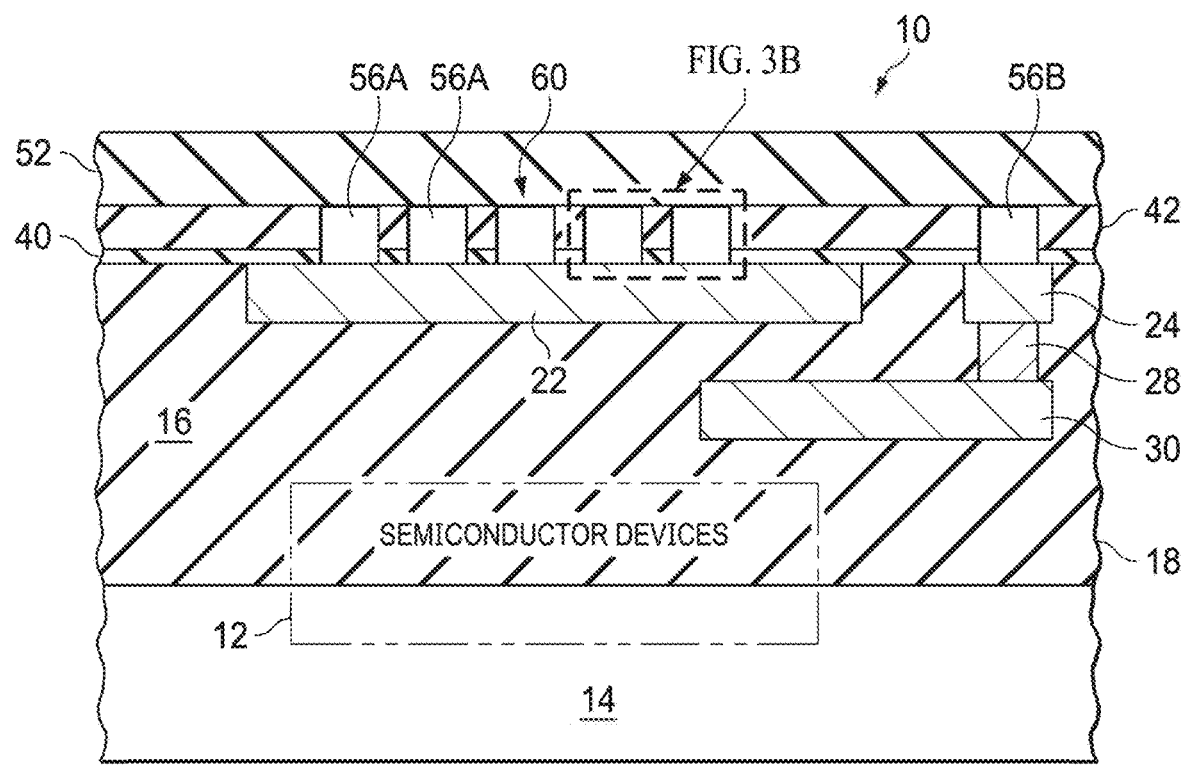

FIG. 3A shows a cross-sectional view of the IC die structure 10 after further processing. As shown, a sealing layer 52 may be deposited or formed over the non-metal layer 42 (e.g., oxide dielectric layer), which may seal the top of the previously formed openings 46A, 46B in the non-metal layer 42, to thereby define an array of sealed voids 56A over the shock plate 22 and sealed one or more sealed voids 56B formed over vias/conductive region(s) 28. In some embodiments, the sealing layer 52 may comprise a non-conformal inter-metal dielectric (IMD) layer, e.g., performed in a self-aligned dual damascene (SADD) process such as disclosed in pending U.S. patent application U.S. Ser. No. 14/735,425, the entire contents of which application are hereby incorporated by reference. In some embodiments, a partial vacuum is generated in the sealed voids 56A and/or 56B In particular, the capping (final) deposition that seals the tops of the voids may be performed done under a partial vacuum. Because the voids are (hermetically) sealed under partial vacuum, the voids retain the lower pressure.

The non-metal layer 42 including the array of sealed voids 56A may be referred to as a "force mitigation layer" indicated at 60, as such layer may reduce or mitigate under-pad stresses caused by a subsequent wire bond over the sealed voids 56A, as discussed below.

Figure 3B:
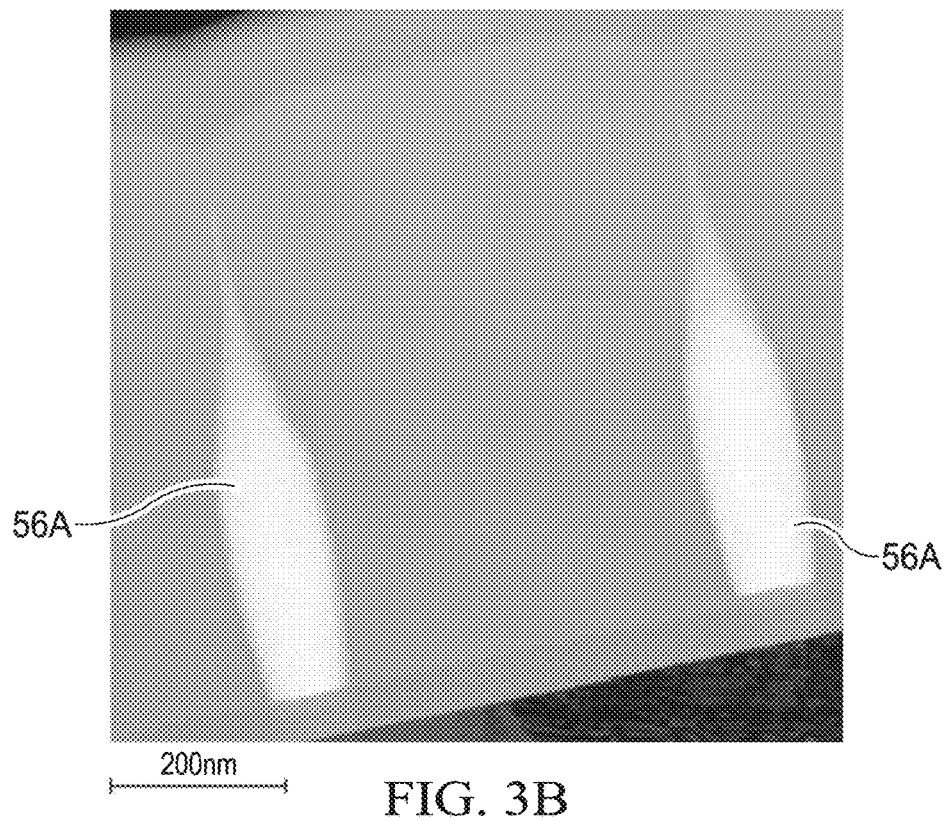

FIG. 3B shows an example SEM image of a pair of sealed voids 56A for an example force mitigation layer 60, formed according to an example embodiment.

Figure 4A:
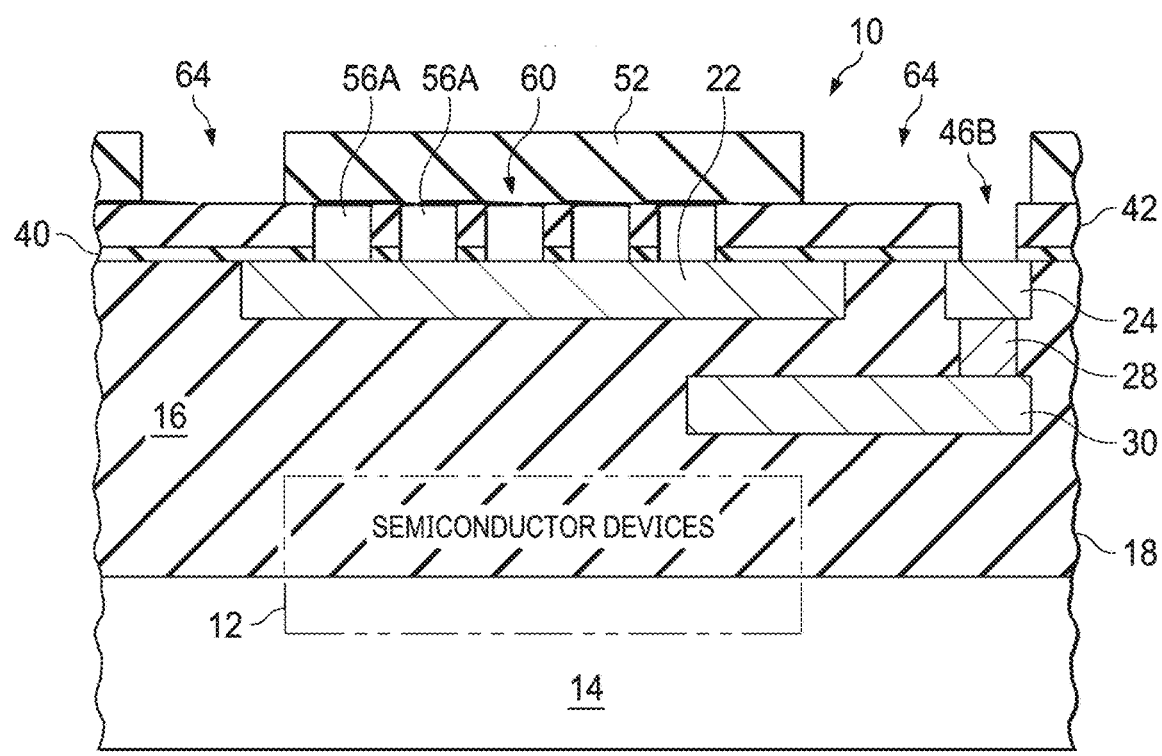
Figure 4B:
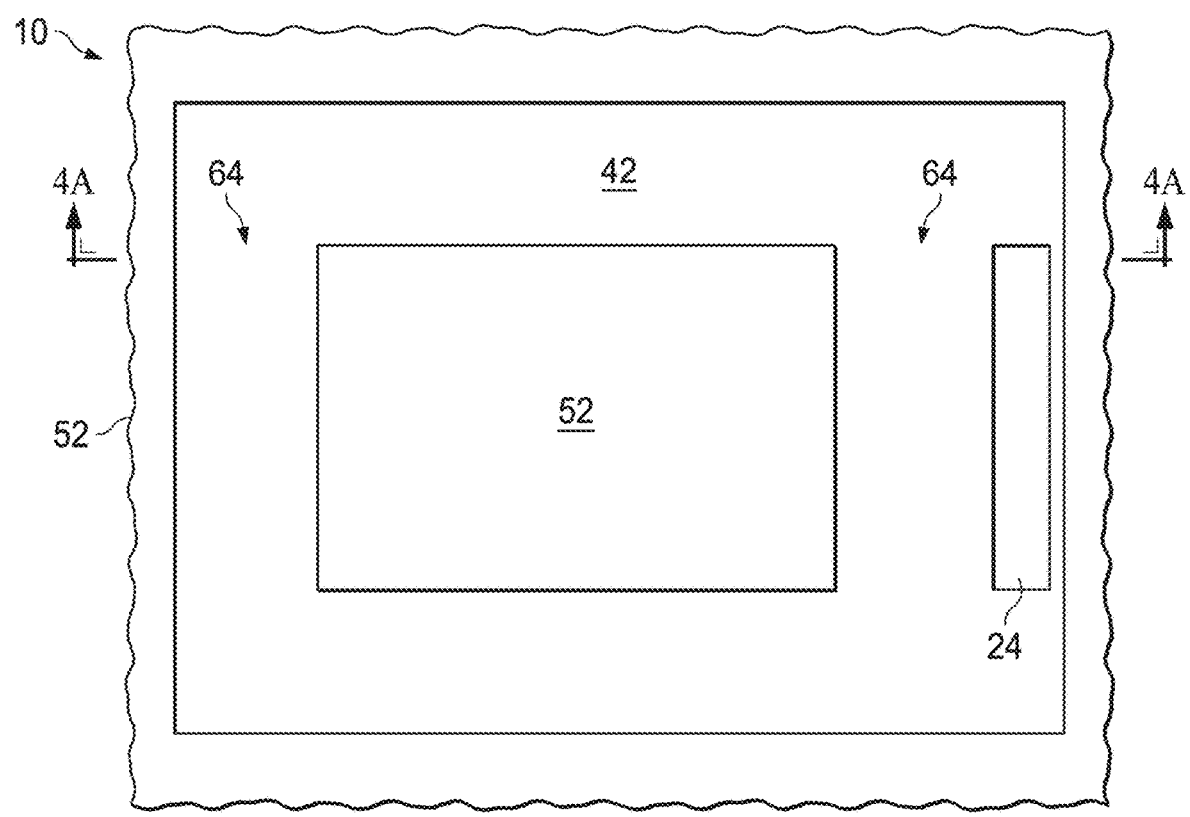

FIGS. 4A and 4B show a side cross-sectional view and top view, respectively, of the IC die structure 10 after further processing. As shown, a pattern and etch may be performed to define one or more trenches 64 in the sealing layer 52 and/or force mitigation layer 60 for subsequently receiving a top metal layer. In the illustrated example, the etched trench 64 uncovers previously formed opening 46B connected to via/conductive region 24 (which opening 46B was previously covered by sealing layer 52 to temporarily define a sealed void 56B, as shown in FIG. 3B).

Figure 5:
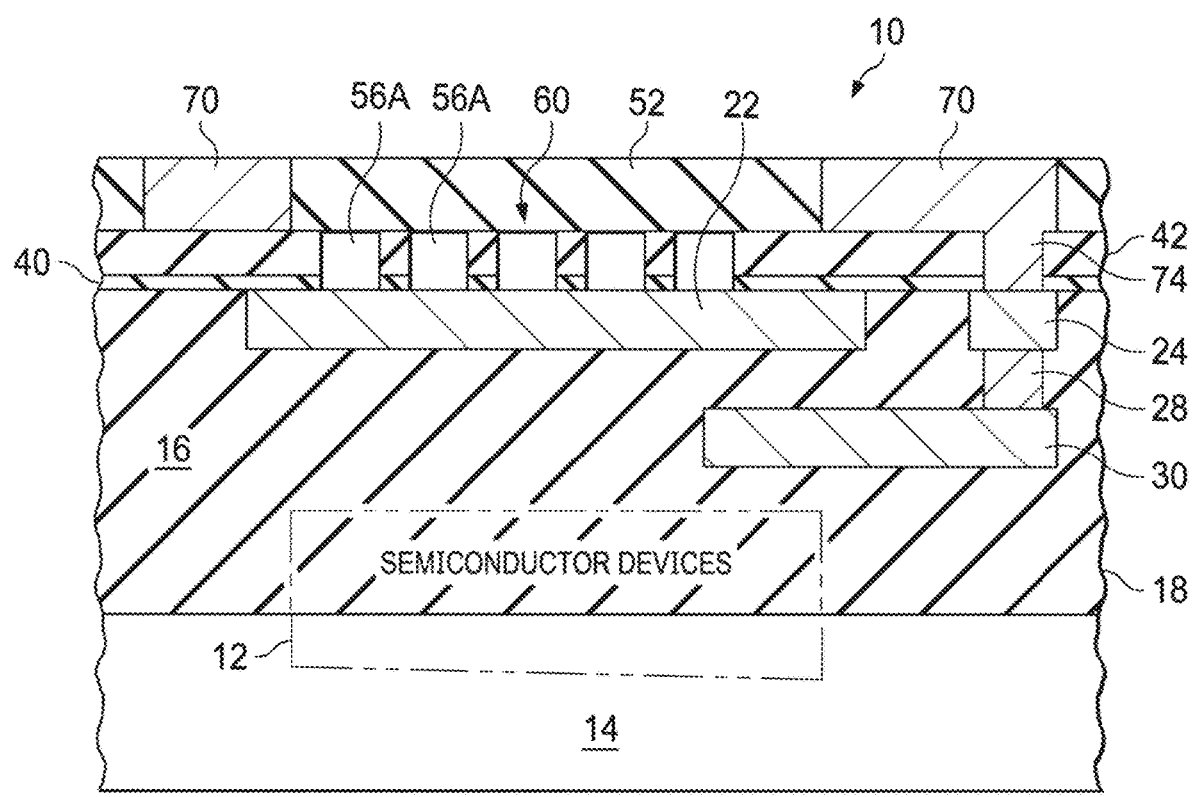

FIG. 5 shows a side cross-sectional view of the IC die structure 10 after further processing. As shown, a top metal layer 70 may be formed by depositing a metal or other conductive material into the trench(es) 64 etched in the sealing layer 53 and/or force mitigation layer 60, and polishing the top surface. Because opening 46B formed below force mitigation layer 60 was exposed by the etch shown in FIGS. 4A and 4B, a dual damascene process may be used to fill both the trench 64 and the underlying opening 46B to define a conductive via 74, to thereby provide a contiguous conductive connection from the top metal layer 70 to selected (e.g., deeper) metal layer(s) 30 or other conductive element(s) in the die. Top metal layer 70 may comprise copper or any other suitable metal.

Figure 6:
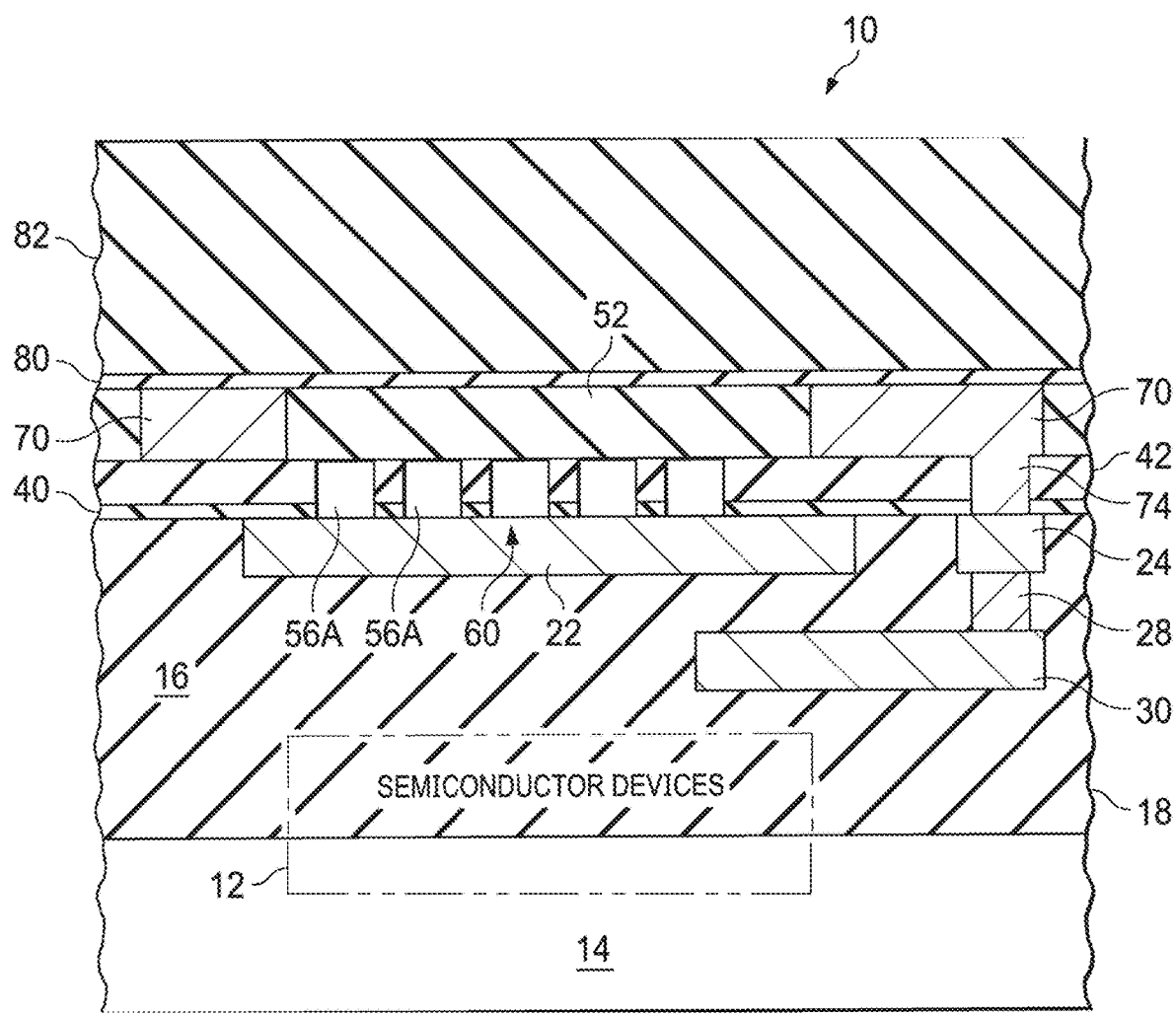

FIG. 6 shows a side cross-sectional view of the IC die structure 10 after further processing. In particular, a Cu barrier dielectric layer 80 (e.g., including SiN or SiC) may be formed over the sealing layer 52/metal top layer 70, to seal the top metal layer 70, followed by a deposition of a passivation layer 82 over the structure. Passivation layer 82 may be a dielectric layer, e.g., comprising SiN plus oxides.

Figure 7A:
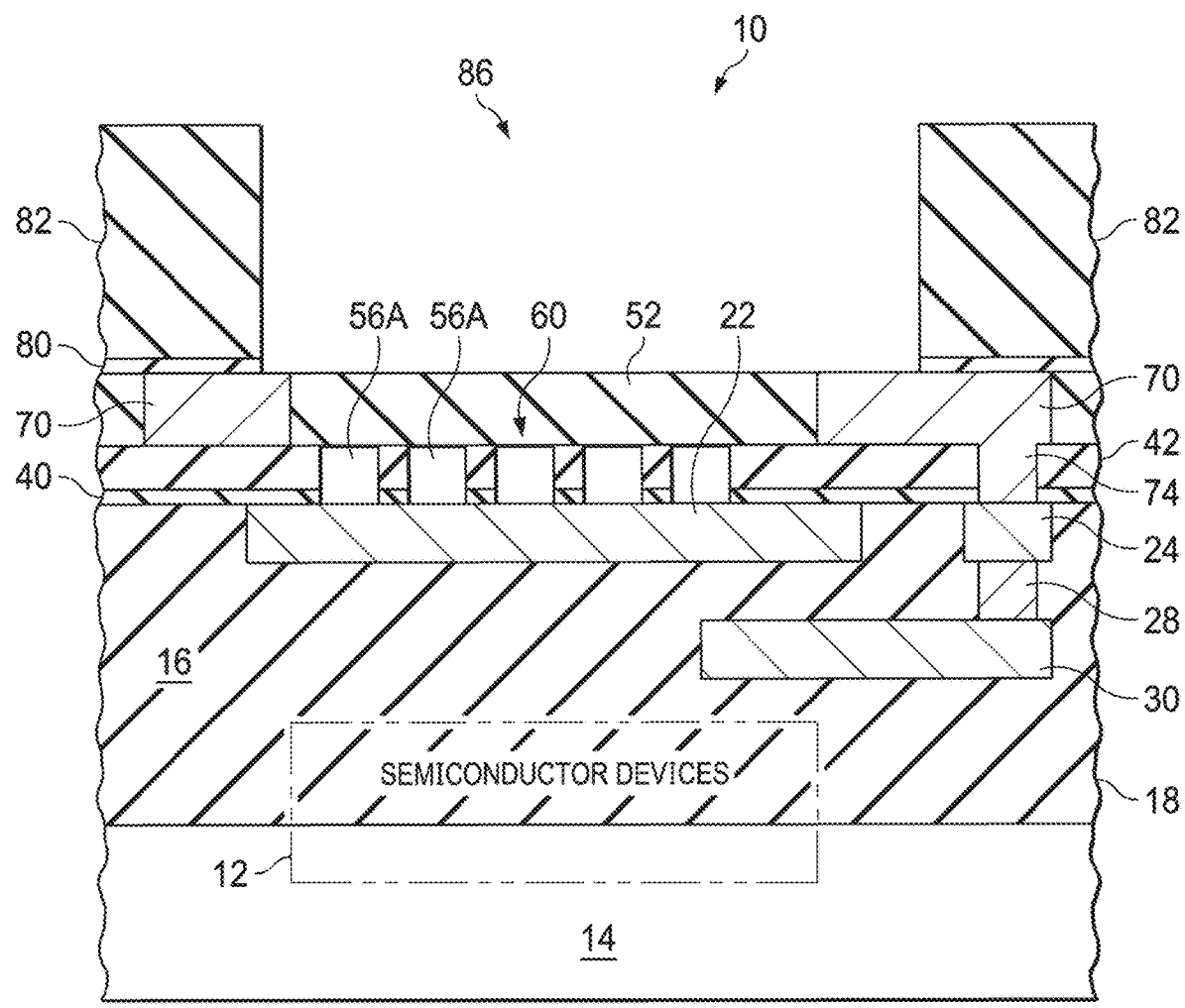
Figure 7B:
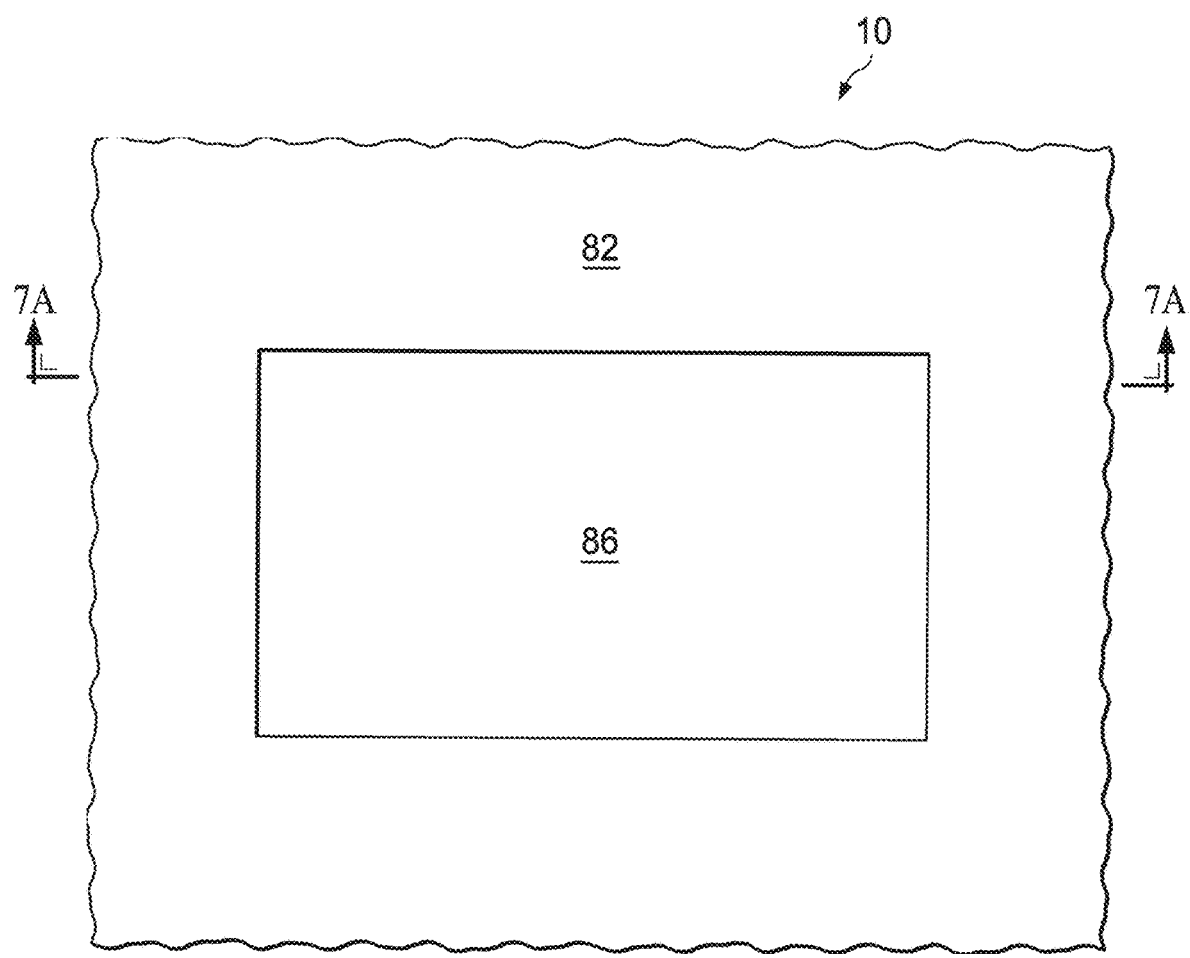

FIGS. 7A and 7B show a cross-sectional view and top view, respectively, of the IC die structure 10 after patterning and etching the passivation layer 82 down to the metal top layer 70 to form a bond pad trench 90 for receiving a conductive bond pad, as discussed below.

Figure 8A:
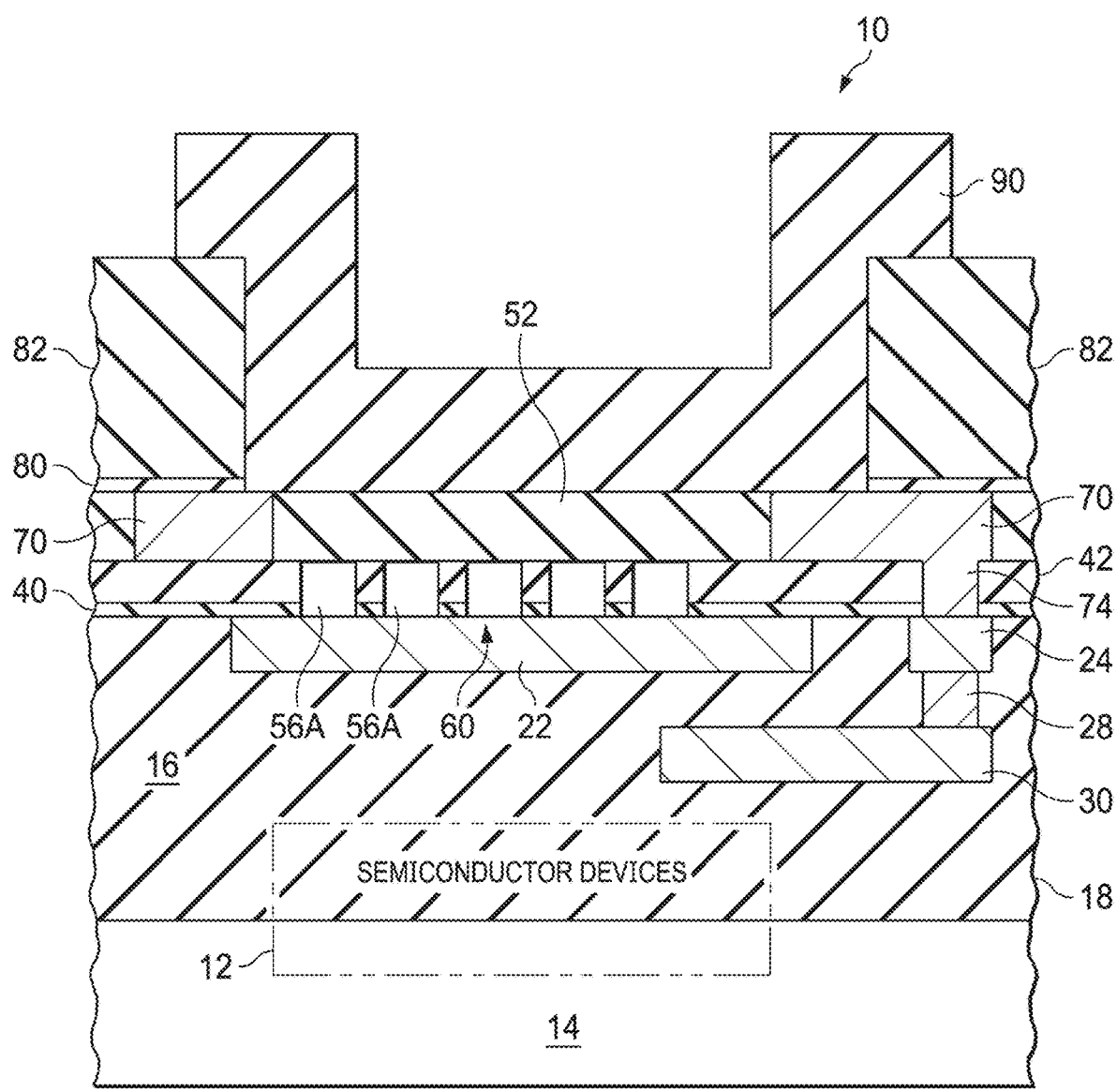
Figure 8B:
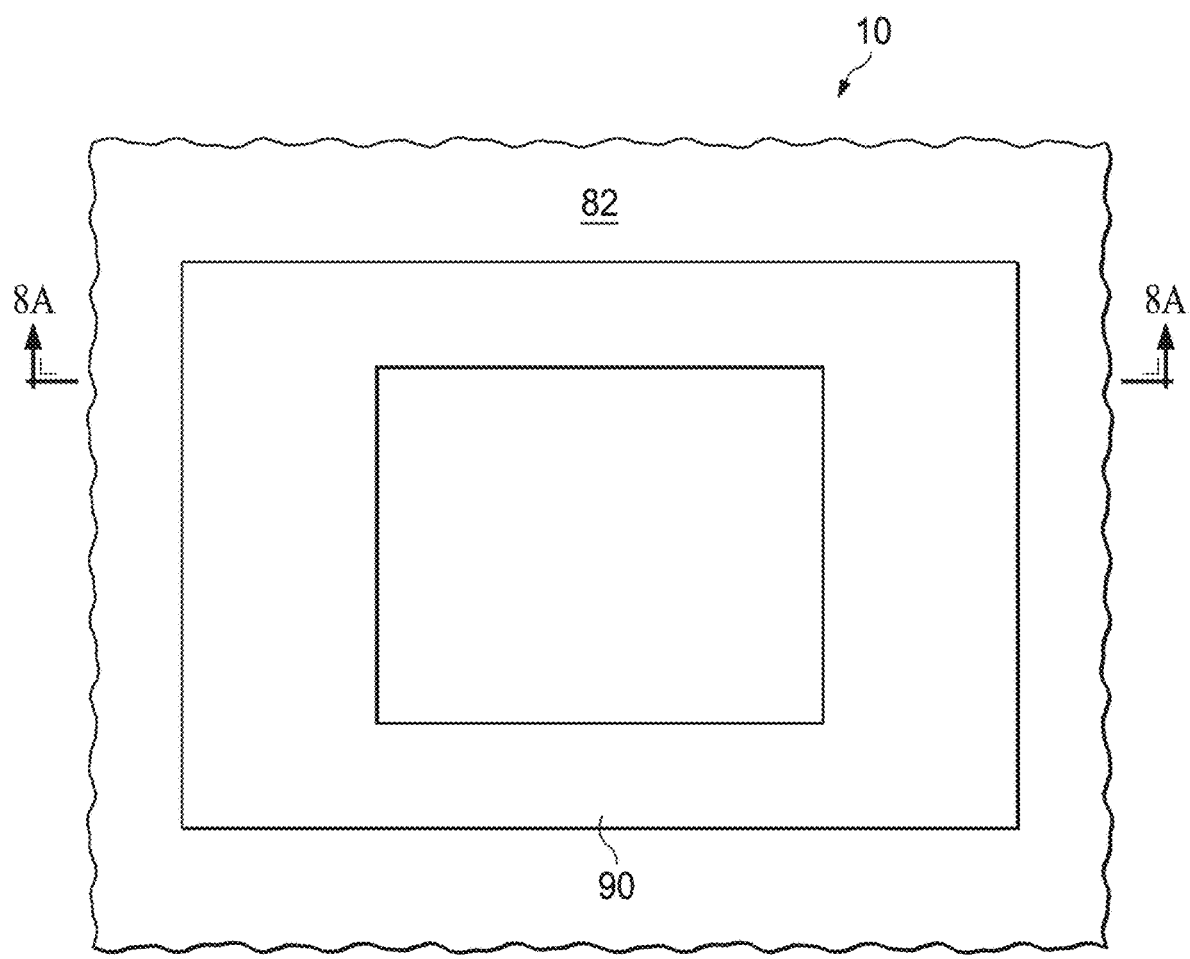

FIGS. 8A and 8B show a cross-sectional view and top view, respectively, of the IC die structure 10 after depositing a bond pad 90 in the bond pad trench. The bond pad 90 may contact one or more areas of the metal top layer 70, e.g., to provide a conductive path to selected metal line(s) or other conductive elements, e.g., metal layer 30 or other elements in the die. The bond pad 90 may comprise aluminum or any other suitable conductive material.

Figure 9A:
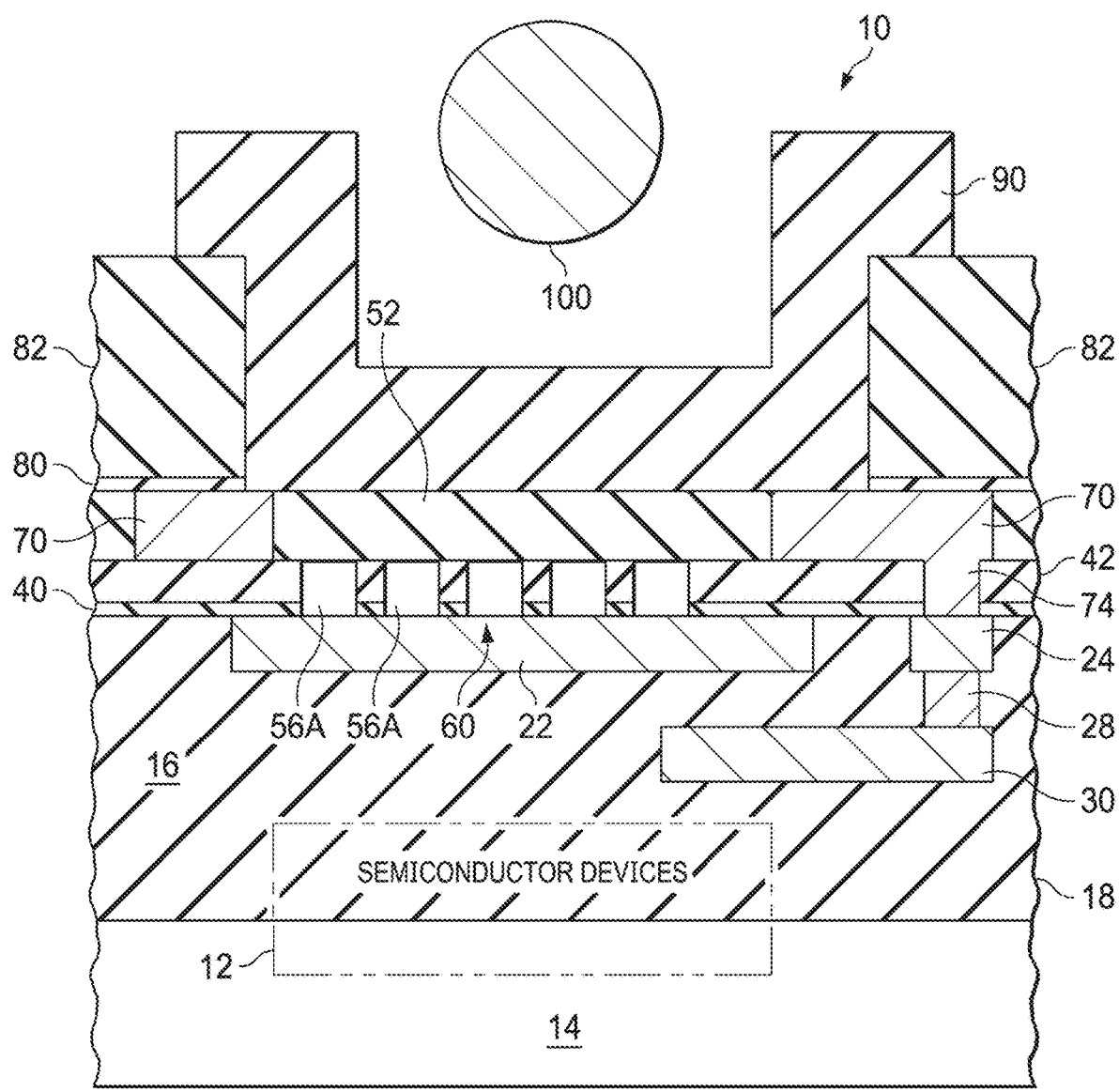
FIGS. 9A and 9B illustrate a wire/ball bond on the IC die structure formed according to the example method shown in FIGS. 1A-8B, according to an example embodiment of the invention.
Figure 9B:
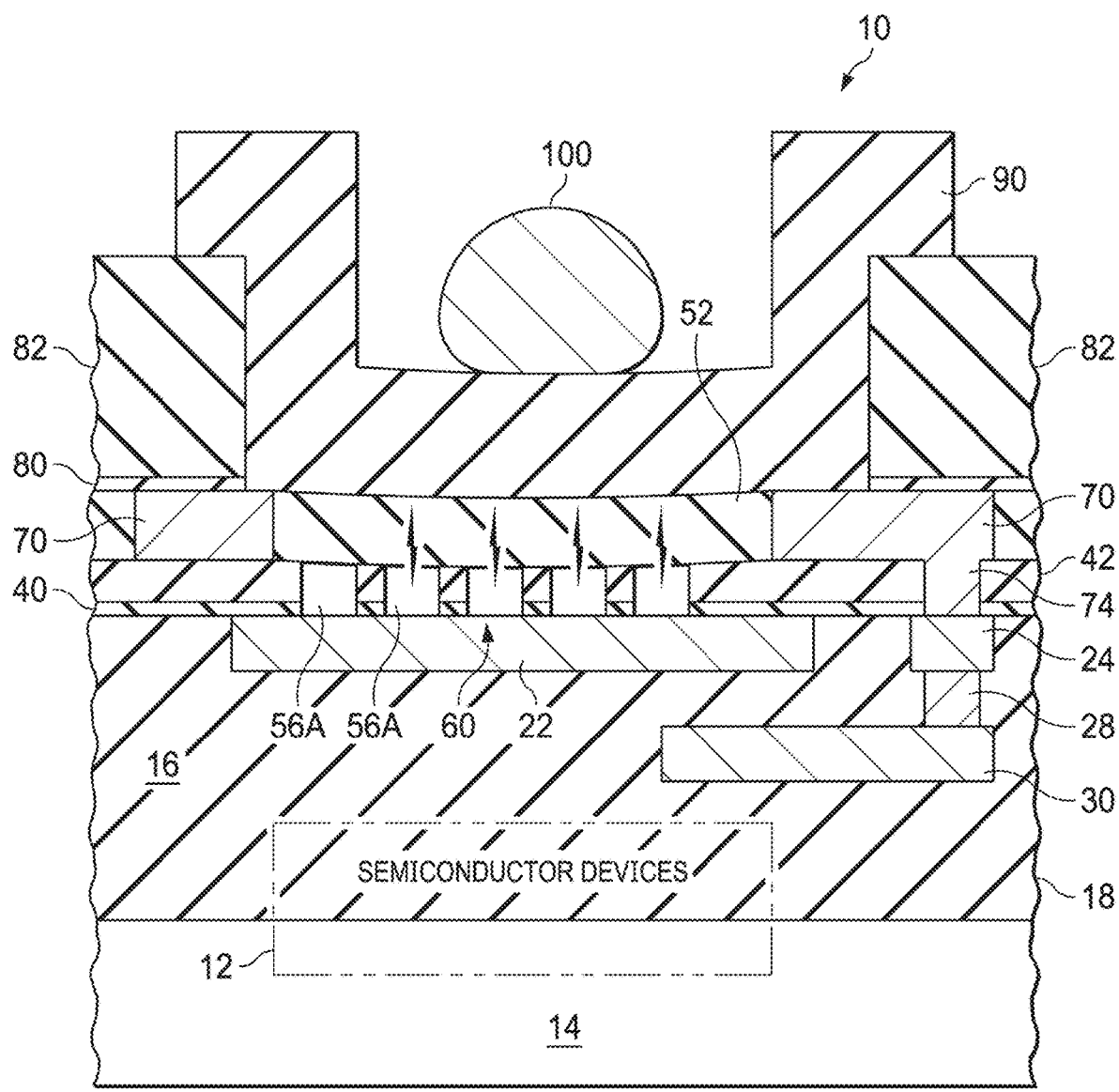

FIGS. 9A and 9B illustrate a wire/ball bond 100 on the IC die structure 10 shown in FIG. 8A, in particular, on the bond pad 90 formed over the force mitigation layer 60 including an array of sealed voids 56A, and underlying shock plate 22, as disclosed above. FIG. 9C illustrates that the force mitigation layer 60 (including voids 56A) and metal shock plate 22, may act as a shock absorber to reduce stresses and damage in region 16 under the metal shock plate 22, e.g., by flexing or causing controlled fracturing in the structure with reduced or no propagation of fracturing below the shock plate. In some embodiments, the force mitigation layer 60 and shock plate 22 may reduce both tensile and compressive stresses in the die structure caused by the wire/ball bond, which may protect semiconductor devices 12, including ESDs and/or non-ESDs, located in region 16 from damage.

In some embodiments, the force mitigation layer 60 including voids 56A may force damage during wire bonding to specific areas in the die and provide a higher level of control over the wire bond process.

Figure 10A:
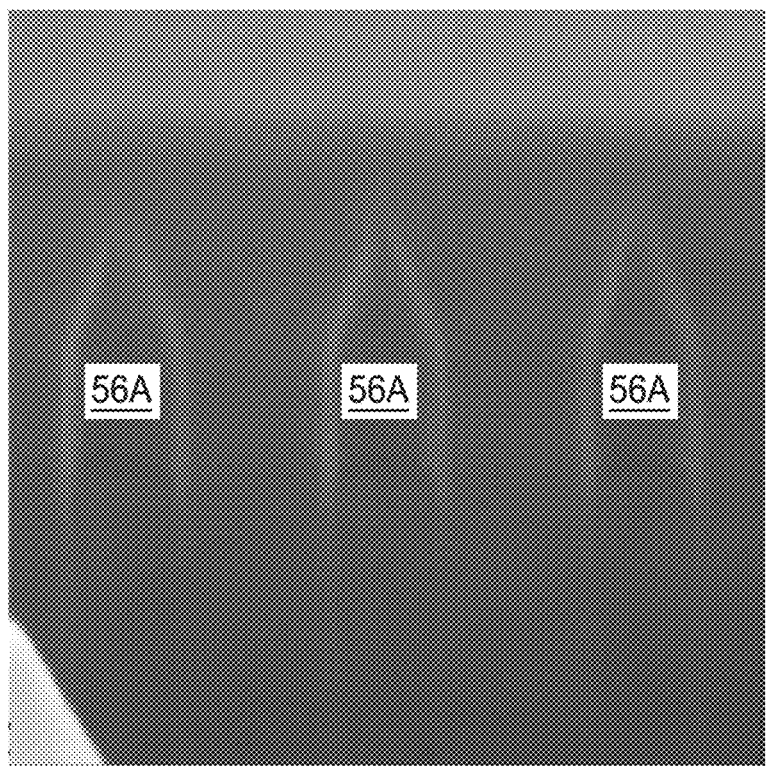
FIGS. 10A and 10B show microscope images of example voids in the force mitigation layer, according to an example embodiment of the invention.
Figure 10B:
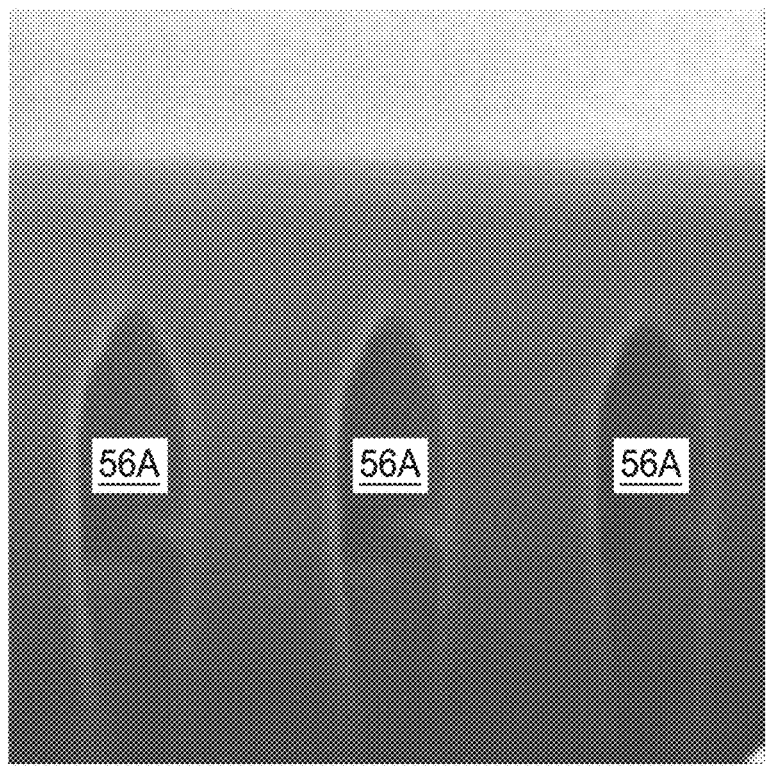

FIGS. 10A and 10B show SEM images of example voids 56A in the force mitigation layer 60, e.g., formed using a process as disclosed above. FIG. 10A shows three example voids 56A at a center region of the void array, while FIG. 10B shows three example voids 56A at an edge region of the void array.

The invention claimed is:

1. A method of forming a silicon die, the method comprising:
   forming a metal region above a substrate;
   forming a non-metal layer over the metal region;
   forming a plurality of openings in the non-metal layer aligned directly over the metal region;
   forming a non-metal sealing layer over the plurality of openings in the non-metal layer, wherein the non-metal sealing layer seals a top side of the openings to define a plurality of sealed voids aligned directly over the metal region; and
   forming a wire bond pad over the non-metal sealing layer.

2. The method of claim 1, wherein semiconductor devices are formed in a region of the die below the metal region.

3. The method of claim 2, wherein the semiconductor devices include at least one non-electrostatic-sensitive device (non-ESD).

4. The method of claim 1, comprising:
   forming a dielectric region over the substrate; and
   forming the metal region on or in the dielectric region over the substrate.

5. The method of claim 1, wherein:
   the non-metal layer over the metal region comprise an oxide dielectric layer; and
   forming the plurality of openings in the non-metal layer comprises forming a plurality of vias in the oxide dielectric layer.

6. The method of claim 1, wherein forming the non-metal sealing layer over the plurality of openings in the non-metal layer comprises forming a non-conformal inter-metal dielectric (IMD) layer over the plurality of openings.

7. The method of claim 1, further comprising forming a passivation layer over the sealed voids.

8. The method of claim 1, further comprising bonding a wire to the wire bond pad.

9. The method of claim 1, wherein forming the plurality of openings in the non-metal layer comprises forming a two-dimensional array of openings in the non-metal layer.

10. The method of claim 1, further comprising forming at least one metal line in or above the non-metal sealing layer;
    wherein the wire bond pad is conductively coupled to the at least one metal line in or above the non-metal sealing layer.

11. The method of claim 1, further comprising creating a partial vacuum in the sealed voids.

12. The method of claim 1, comprising forming the sealed voids such that each sealed void has a lateral width that gradually reduces in a tapered manner toward a top end of the sealed void.

13. A method of forming a semiconductor package, the method comprising:
    forming one or more semiconductor devices in or above a substrate;
    forming a metal shock plate region above the one or more semiconductor devices;

forming a force mitigation structure above the metal shock plate region, the force mitigation structure including a plurality of sealed voids defined in a non-metal region and aligned directly over the metal shock plate, the plurality of sealed voids being sealed by a non-metal sealing layer formed on a top side of the sealed voids; and forming a bond pad above the force mitigation layer.

14. The method of claim 13, wherein the non-metal region comprises an oxide dielectric layer.

15. The method of claim 13, wherein the non-metal sealing layer formed on the top side of the sealed voids comprises a non-conformal inter-metal dielectric (IMD) layer.

16. A method of forming an electronic device, the method comprising:

forming a silicon die by a process including:
   forming a metal region above a substrate;
   forming a non-metal layer over the metal region;
   forming a plurality of openings in the non-metal layer and aligned over the metal shock plate;
   forming a sealing layer over the plurality of openings in the non-metal region to define a plurality of sealed voids aligned directly over the metal region, wherein the plurality of sealed voids define a force mitigation structure; and
   forming a wire bond pad over the sealing layer; and
performing a bond process to form a conductive connection to the wire bond pad, wherein the bond process imparts a force on the force mitigation structure.

17. The method of claim 16, wherein performing the bond process comprises performing a solder ball bonding process that imparts a force on the force mitigation structure.

18. The method of claim 16, wherein performing the bond process comprises performing a wire bond process to connect the silicon die to an electronic component, wherein the wire bond process imparts a force on the force mitigation structure.

19. The method of claim 16, wherein:
the non-metal region comprises an oxide dielectric layer; and
the sealing layer comprises a non-conformal inter-metal dielectric (IMD) layer.

20. The method of claim 16, comprising forming a two-dimensional array of the sealed voids.

21. A method of forming a silicon die, the method comprising:
forming a metal region above a substrate;
forming a non-metal layer over the metal region;
forming a plurality of openings in the non-metal layer and aligned directly over the metal shock plate;
forming a sealing layer over the plurality of openings in the non-metal layer to define a plurality of sealed voids aligned directly over the metal region;
forming at least one metal line in or above the sealing layer; and
forming a wire bond pad over the sealing layer;
wherein the wire bond pad is conductively coupled to the at least one metal line formed in or above the sealing layer.

22. A method of forming a silicon die, the method comprising:
forming a metal region above a substrate;
forming a non-metal layer over the metal region;
forming a plurality of openings in the non-metal layer;
forming a non-metal sealing layer over the plurality of openings in the non-metal layer, wherein the non-metal sealing layer seals a top side of the openings to define a plurality of sealed voids over the metal region, wherein respective sealed voids have a lateral width that gradually reduces in a tapered manner toward a top end of the respective sealed void; and
forming a wire bond pad over the non-metal sealing layer.

* * * * *